United States Patent [19]

Berdahl

[11] Patent Number: 4,628,695

[45] Date of Patent: Dec. 16, 1986

[54] SOLID STATE RADIATIVE HEAT PUMP

[75] Inventor: Paul H. Berdahl, Oakland, Calif.

[73] Assignee: The United States of America as represented by the United States Department of Energy, Washington, D.C.

[21] Appl. No.: 655,500

[22] Filed: Sep. 28, 1984

[51] Int. Cl.$^4$ ............................................. F25B 21/02
[52] U.S. Cl. ........................................................ 62/3
[58] Field of Search ................. 136/203, 204; 165/186, 165/48 R; 62/3

[56] References Cited

U.S. PATENT DOCUMENTS

| | | | |
|---|---|---|---|
| 3,091,939 | 6/1963 | Baude | 62/3 |
| 3,103,587 | 9/1963 | Ure, Jr. et al. | 62/3 X |
| 3,127,749 | 4/1964 | Berguall et al. | 62/3 |
| 3,366,164 | 1/1968 | Newton | 62/3 X |
| 3,937,028 | 2/1976 | Alais | 62/3 |
| 4,065,936 | 1/1978 | Fenton et al. | 62/3 |
| 4,280,330 | 7/1981 | Harris et al. | 62/3 |

Primary Examiner—Lloyd L. King
Attorney, Agent, or Firm—Clifton E. Clouse, Jr.; Roger S. Gaither; Judson R. Hightower

[57] ABSTRACT

A solid state radiative heat pump (10, 50, 70) operable at room temperature (300° K.) utilizes a semiconductor having a gap energy in the range of 0.03–0.25 eV and operated reversibly to produce an excess or deficit of charge carriers as compared to thermal equilibrium. In one form of the invention (10, 70) an infrared semiconductor photodiode (21, 71) is used, with forward or reverse bias, to emit an excess or deficit of infrared radiation. In another form of the invention (50), a homogeneous semiconductor (51) is subjected to orthogonal magnetic and electric fields to emit an excess or deficit of infrared radiation. Three methods of enhancing transmission of radiation through the active surface of the semiconductor are disclosed. In one method, an anti-reflection layer (19) is coated into the active surface (13) of the semiconductor (11), the anti-reflection layer (19) having an index of refraction equal to the square root of that of the semiconductor (11). In the second method, a passive layer (75) is spaced from the active surface (73) of the semiconductor (71) by a submicron vacuum gap, the passive layer having an index of refractive equal to that of the semiconductor. In the third method, a coupler (91) with a paraboloid reflecting surface (92) is in contact with the active surface (13, 53) of the semiconductor (11, 51), the coupler having an index of refraction about the same as that of the semiconductor.

35 Claims, 10 Drawing Figures

SOLID STATE RADIATIVE HEAT PUMP

The United States Government has rights in this invention pursuant to Contract No. DE-AC03-76 SF00098 between the U.S. Department of Energy and the University of California.

BACKGROUND OF THE INVENTION

The present invention relates to heat pumps and more particularly to radiant heat pumps utilizing radiative semiconductors.

A radiant heat engine can be defined as a Carnot heat engine in which one heat sink is in thermal contact with a radiating surface obeying Kirchhoff's law and the other heat sink is a general environment at room temperature (i.e. in the order of 300 K.). Work can be performed by such a radiant heat engine if the incident radiant energy received by the radiating surface differs from the black body radiation of the general environment. Such an engine can also absorb work and produce radiant heat fluxes different from that of a black body at the environmental temperature. In this mode the device is a radiative heat pump.

More particularly, the radiative heat pump system contemplated by the present invention is an enclosed chamber having a wall which is thermally conductive and in thermal contact with an external heat sink and in which the other heat sink is the contents of the chamber. A radiative semiconductor, similar in principle to a light emitting diode (LED), but operating in the thermal infrared region (5 to 40 microns wavelength), is placed in thermal contact with the thermally conductive chamber wall and positioned to radiate energy into the interior of the chamber.

If the external heat sink and the contents of the chamber are at the same temperature, and the semiconductor is not operating, the system will be in equilibrium with the black body radiation from the interior of the chamber which is absorbed by the semiconductor being balanced by the thermal radiation emitted from the semiconductor.

If the semiconductor is now operated to cause its infrared radiation to increase and exceed the black body radiation from the chamber, then the chamber contents will absorb such excess radiation and increase in temperature. It is known that LED's can be configured so that more energy in the form of light is emitted from them than is consumed in the form of electricity. The additional energy is provided by the semiconductor lattice in the form of heat, and heat removal by radiation results in lowering of the lattice's temperature. Such cooling of the semiconductor will cause it to absorb heat from the external heat sink so that part of the heat pumped into the chamber comes from the external heat sink.

A radiative heat pump should preferably be reversible in operation so that it could be used to cool the contents of the chamber. Thus, if the semiconductor is operated so that it will radiate less energy in the thermal infrared region than that emitted by the chamber, then the semiconductor will absorb more energy from the chamber interior than will be radiated from the semiconductor back into the chamber. The net loss of energy from the chamber interior will cause its temperature to decrease. Conversely, the net absorption of energy by the semiconductor will cause its temperature to increase, and it will give up heat to the external heat sink. If the electrical energy required for operation is less than the amount of energy given up by the semiconductor to the exterior heat sink, then the system operates to pump heat from the chamber interior to the exterior heat sink.

As mentioned above, it is known that LED's can be operated so that more energy in the form of light is emitted from them than is consumed in the form of electrical energy. For example, see U.S. Pat. No. 2,898,743 to Bradley. As such, refrigeration produced by such LED's is theoretically possible, although to date a net cooling effect has not been observed with such devices. Insofar as is known, there has been no discussion in the prior art of the operation of a semiconductor in such manner that it will produce less radiant emission than normal so that it can be a net absorber of black body radiation and produce cooling by such absorption.

Laser-pumped fluorescence can also achieve a cooling effect by an excess of radiant energy, but again, a net cooling effect has not yet been observed with this approach, and the operation is not reversible.

In principle, the LED and laser-pumped fluorescence approaches can pump heat, with the maximum coefficient of performance (COP) being limited only by the second law of thermodynamics. That is, the Carnot COP, $(T_1/T_2-T_1)$, $T_1$ and $T_2$ being the heat sink temperatures, is the limit of performance. The net rate of heat transfer is proportional to a statistical Boltzmann factor F, $F=\exp(-E_{gap}/kT)$, where $E_{gap}$ is the semiconductoring gap energy for the LED, and kT is about 1/40 eV at 300 K. For typical LED semiconductors with $E_{gap}$ in the order of 1 eV, the factor F is about $4\times10^{-18}$. Thus good thermodynamic performance (i.e. a high COP) is incompatible with a high rate of heat pumping.

SUMMARY OF THE INVENTION

It is an object of the invention to increase the rate at which heat can be pumped by a solid state radiative heat pump by decreasing the statistical Boltzmann factor of the system.

It is another object of the invention is to provide a solid state radiative heat pump which is reversible in operation.

Yet another object of the invention to increase the rate at which heat can be pumped by a solid state radiative heat pump by a substantial decrease of the amount of total internal reflection of the semiconductor.

Additional objects, advantages and novel features of the invention will be set forth in the description which follows, and in part will become apparent to those skilled in the art upon examination of the following, or may be learned by practice of the invention. The objects and advantages of the invention may be realized and attained by means of the instrumentalities and combinations particularly pointed out in the appended claims.

To achieve the foregoing and other objects and in accordance with the present invention, as embodied and broadly described herein, a solid state radiative heat pump is provided having a thin film semiconductor capable of emitting therefrom a deficit of infrared radiation (compared to the thermal equilibrium radiation) when a charge carrier deficit is present in the semiconductor, and means for producing a deficit of charge carriers.

In one embodiment of the invention, the semiconductor is an infrared photodiode with a p-n junction, and a deficit of charge carriers is produced by operating with a reverse bias. In another embodiment of the invention, orthogonal electric and magnetic fields are used to produce a deficit of charge carriers in a semiconductor.

In order to pump heat at a high rate while maintaining high thermodynamic efficiency, the semiconductor should be formed of a material having a direct bandgap with a gap energy in the range of 0.03–0.25 eV.

In order to provide reversible heat pump operation, the semiconductor should also be capable of emitting an excess of infrared radiation when a charge carrier excess is present, and there should be means to produce such carrier excess. In the diode embodiment, the diode is operated with forward or reverse bias. In the other embodiment, either the electrical or magnetic field is reversible in direction.

One mode of enhancing transmission of radiation through the active surface of the semiconductor is achieved by coating the active surface with a coating which is transparent to infrared radiation and which has an infrared index of refraction approximately equal to the square root of the index of refraction of the semiconductor.

Another mode of enhancing the transmission of radiation is achieved by spacing a passive sheet away from the active surface of the semiconductor, the spacing being no more than about one micron, the passive sheet having an infrared index of refraction substantially equal to that of the semiconductor, and there being a vacuum in the space between the semiconductor and the passive sheet.

Still another mode of enhancing the transmission of radiation is achieved by interfacing the active surface of the semiconductor with a coupler having substantially the same index of infrared refraction, the coupler having a reflective surface and being shaped to collimate the emission from the semiconductor.

BRIEF DESCRIPTION OF THE DRAWINGS

The accompanying drawings, which are incorporated in and form part of the specification, illustrate embodiments of the present invention, and, together with the description, serve to explain the principles of the invention.

DETAILED DESCRIPTION OF THE INVENTION

The solid state radiative heat pump of the present invention includes: a semiconductor that can emit a thermal infrared radiation excess or deficit (compared to thermal equilibrium) when a charge carrier (electron or hole) excess or deficit is present; a reversible means of producing an excess or deficit of charge carriers; a means for enhancing the transmission of infrared photons through the active surface of the semiconductor from inside to outside and vice versa; and means for inhibiting the transmission of infrared photons through the opposite, or back, surface of the semiconductor.

Figure 1:
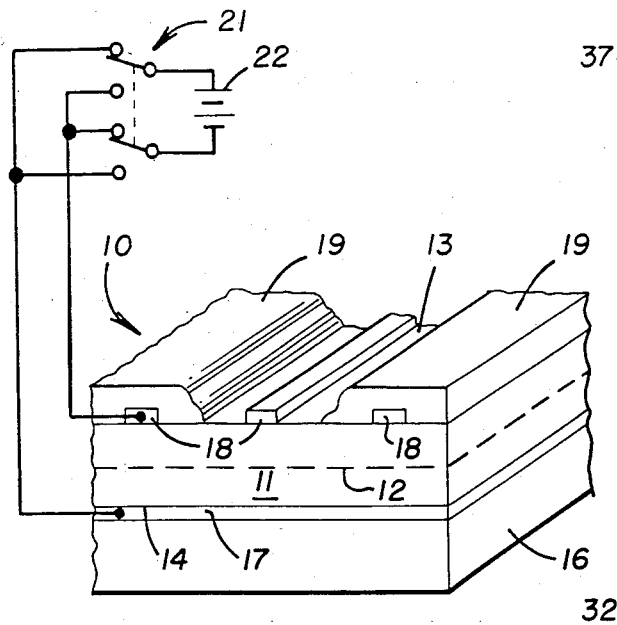
FIG. 1 is a simplified perspective illustration of a solid state radiative heat pump made in accordance with the present invention.

FIG. 1 illustrates generally one form of a solid state radiative heat pump 10 that is usable in the present invention. The heat pump 10 includes a semiconductor fabricated as a thin film infrared photodiode 11 having a p-n junction 12 at the interface of the p and n regions in the semiconducting material, and a large area active surface 13 through which infrared radiation can be emitted and absorbed. The active surface 13 should be etched or otherwise treated to provide a low surface recombination velocity. The back surface 14 of the photodiode 11 is supported on a suitable substrate 16.

A thin metallic layer 17, for example made of aluminum, is disposed between the diode 11 and the substrate 16 and serves as the back electrical contact for the device. This layer 17 also reflects infrared radiation and thus acts as a means for inhibiting the transmission of infrared radiation through the back surface 14 of the photodiode.

A plurality of narrow, electrically-interconnected metallic conductors 18 are deposited on the active surface 13 to serve as front contacts. The arrangement of the front contacts 18 should, of course, enable uniform energization of the photodiode 11 without undue interference with emission or absorption of infrared radiation through the active surface 13 of the photodiode.

In order to emit or absorb a high degree of equilibrium infrared radiation present at room temperature, i.e. in the order of 300 K., the photodiode 11 must be made from a material with a low gap energy, $E_{gap}$, preferably in the range of 0.03–0.25 eV. A photodiode fabricated from mercury cadmium telluride, $Hg_{1-x}Cd_xTe$, can have a narrow direct bandgap with any gap energy in the range of 0.03–0.25 eV by suitable choice of the ratio of mercury to cadmium. An indium antimonide, InSb, photodiode will have a gap energy in the order of 0.17 eV. Other suitable narrow direct-bandgap materials are lead tin tellurides, i.e. alloys of lead telluride and tin telluride in the form of $Pb_xSn_{1-x}Te$, and bismuth telluride, $Bi_2Te_3$.

A wide bandgap semiconductor fabricated from material doped with impurities having ionization energies in the range of zero to 0.25 eV will also result in the desired production or absorption of infrared photons. A few examples of suitable materials are phosphorous, arsenic, boron or aluminum in silicon, and lithium, germanium, gold or manganese in gallium arsenide.

If a semiconductor with a narrow direct bandgap is used, the thickness of the semiconducting photodiode layer 11 can be less than ten microns. If a wide bandgap semiconductor with appropriate impurities is used, a greater thickness of material is required for complete absorption and emission of the infrared radiation. The required thickness is determined by the amount of doping, together with the impurity absorption cross section, to ensure a high probability of absorption of an infrared photon traversing the layer.

The radiative heat pump 10 also includes an anti-reflection layer 19 coated onto the active surface 13 of photodiode 11 to enhance the transmission of infrared radiation through that surface. Such layer can be fabricated in a customary manner, from a quarter wave thick dielectric material, which transmits infrared radiation and has an infrared index of refraction equal to the square root of the infrared index of refraction of the photodiode 11. Such layer will provide an efficient coupling of internal photons to the external thermal radiative field.

The back and front contacts 17 and 18 of the photodiode 11 are connected by a reversing switch 21 to a suitable battery 22, the switch and battery acting as a reversible means for producing an excess or deficit of charge carriers in the photodiode.

Figure 6:
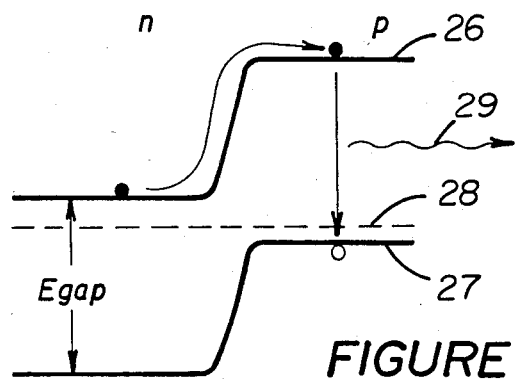
FIG. 6 is an equilibrium band diagram of the p-n junction of a semiconductor.

FIG. 6 illustrates the band structure of a p-n junction in equilibrium, wherein reference numerals 26 and 27 indicate the conduction and valence bands, respectively, and wherein reference numeral 28 indicates the Fermi level.

Under forward bias, electrons are injected through the diode junction to become minority carriers on the p side. (In a like manner, holes may be injected into the n side.) The minority carriers recombine with majority carriers, producing infrared radiation, such recombination radiation being indicated in FIG. 6 by the arrow 29. In the injection process, the more energetic (i.e., hotter) carriers are preferentially injected through the junction. As these hotter carriers recombine to produce radiant infrared energy, the photodiode itself is cooled.

When the photodiode is reverse biased, minority carriers are extracted from the neighborhood of the junction. Due to a lack of minority carriers (compared to thermal equilibrium, relatively less radiation is produced by carrier recombination, but the device can still absorb incoming radiation. Thus, in reverse bias the photodiode will absorb more infrared radiation than it will emit, and it will thus be a net absorber of heat from an object towards which the photodiode faces.

Figure 2:
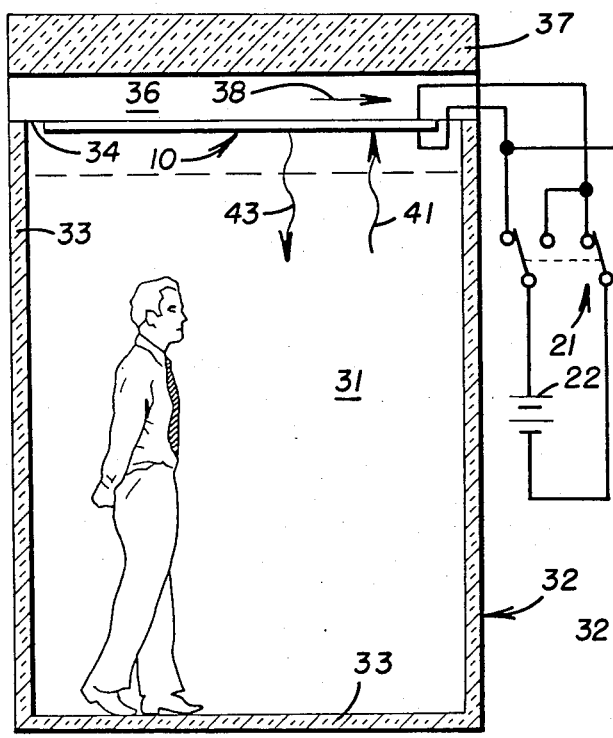

FIG. 2 illustrates a system wherein a solid state radiative heat pump 10 as described above can be used for heating and cooling a conditioned space 31, i.e. the interior 31 of a chamber 32. For purposes of illustration, chamber 32 is illustrated as a room of a house, the room having insulated side and lower walls 33 and a heat conductive upper wall 34. The heat conductive wall 34 is exposed to plenum 36 between wall 34 and roof 37 through which ambient air may flow as indicated by arrow 38. The plenum 36 in this system serves as the external heat sink. The solid state radiative heat pump 10 is mounted on the heat conductive wall 34, with the heat conductive substrate 16 being in good thermal contact with the wall 34 and with the active surface 13 of the photodiode 11 facing towards the conditioned space. Since the heat pump 10 is in good thermal contact with plenum 36, it is isolated from the conditioned space 31 by a suitable convection shield 38 to prevent convective heat transfer between the conditioned space and the heat pump. The convection shield 38 may be of any suitable material which is transparent to infrared radiation, such as a polyethylene film.

Figure 5:
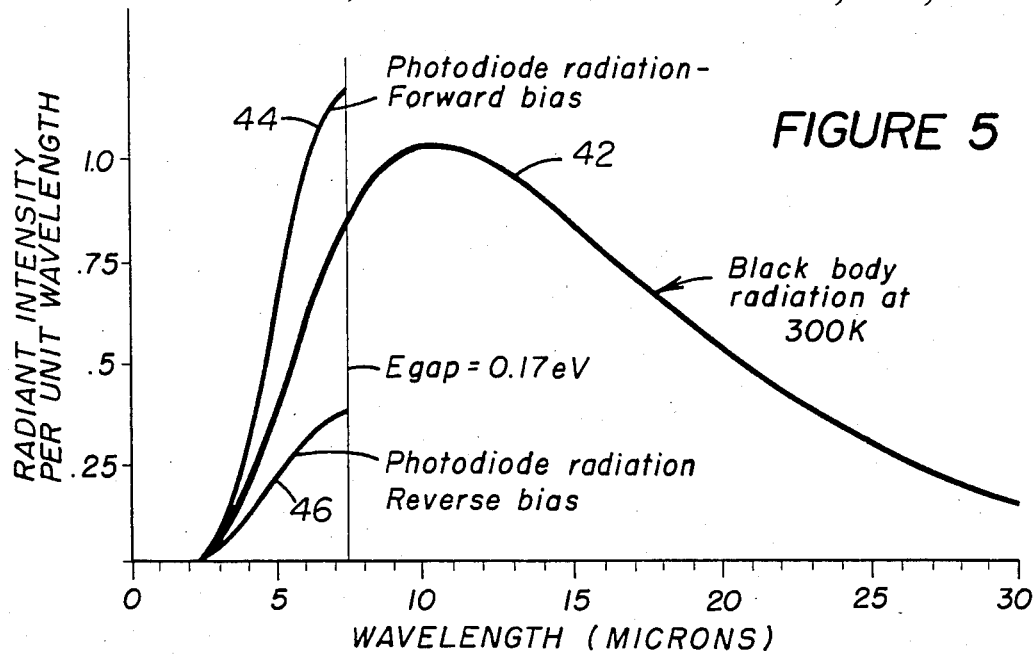
FIG. 5 is a graph of radiant emission at room temperature.

Assuming that the conditioned space 31 (considered here as including all objects in the space and including the enclosing walls 33) is at 300 K., the conditioned space will emit black body radiation, as indicated by arrow 41 in FIG. 2, with such radiation having the energy distribution as shown by curve 42 in FIG. 5. As noted in FIG. 5, black body radiation at 300 K. is in a board range of infrared wavelengths from about three microns (considerably longer than the wavelength of visible light) to over 30 microns, with greatest intensity at about 10 microns. The total energy of the black body radiation at 300 K. is proportional to the area under curve 42.

By like token, if the heat pump 10 is not connected to battery 22 and is also at 300 K., it will emit thermal radiation as indicated by arrow 43 on FIG. 2, towards the conditioned space 31. The emitted radiation from the heat pump will equal that absorbed from the conditioned space and the system will be in thermal equilibrium.

The longest wavelength of recombination radiation of a photodiode is limited by the gap energy in accordance with the equation $E_{gap}=1.24/\lambda$, wherein $\lambda$ is the wavelength in microns. Thus, for an indium antimonide photodiode having a gap voltage of 0.17 eV, the corresponding wavelength is about 7.3 microns.

If the photodiode 11 is forward biased, so that it emits more energy than it absorbs, the radiation for wavelengths up to about 7.3 micron is indicated by curve 44 on FIG. 5. For longer wavelengths, the photodiode will neither emit nor absorb radiation. Instead, it will act as a reflector, reflecting back such longer wavelength radiation that impinge thereon. The total heat energy given up by the photodiode to the conditioned space 31 is the difference in areas under curves 44 and 42 for radiation up to about 7.3 microns.

With reverse bias, and with net absorption of radiant energy, the emission of the photodiode up to about 7.3 microns is as indicated by curve 46 on FIG. 5. Again, for longer wavelengths the photodiode will neither emit nor absorb radiation, but will act as a reflector of such wavelengths. The total heat energy absorbed by the photodiode from the conditioned space 31 is the difference in areas under curves 42 and 46 up to about 7.3 microns.

As is apparent from the equation, $E_{gap}=1.24/\lambda$ and from FIG. 5, the higher the gap energy, $E_{gap}$ of the semiconducting material, the shorter the maximum wavelength of recombination radiation and the less the difference between the curves 44 and 42 or 42 and 46 for forward or reverse bias, respectively, bears with relation to the total area under curve 42. Likewise, the lower the gap energy, the longer the maximum wavelength of recombination radiation so that the net excess or absorbed radiation becomes a greater percentage of the total black body radiation of the conditioned space 31. For efficient operation with high heat pumping capacity, the gap energy, $E_{gap}$, of the semiconducting material should be in the the range of 0.03–0.25 eV (corresponding to a wavelength range of from about 41 to 5 microns) with the optimum gap energy for many applications in the order of 0.10 eV (corresponding to a wavelength of about 12.4 microns).

Referring again to FIG. 2, with switch 21 positioned to place the photodiode of heat pump 10 under forward bias, the infrared radiation 43 from the heat pump will exceed the radiation 41 from the conditioned space 31, causing the temperature of the conditioned space to increase. The energy of the recombination radiation from the photodiode will be greater than the ohmic heating thereof so that the photodiode cools. Since the photodiode is in good thermal contact with the plenum 36, it will absorb heat from the plenum with the temperature of the photodiode is less than the plenum temperature. Thus, a portion of the heat delivered by heat pump 10 to the conditioned space is pumped from the plenum 36.

If the switch 21 is reversed, to place the photodiode under reverse bias, the radiation 41 from the conditioned space 31 will exceed the radiation 43 from the photodiode, and the photodiode will absorb heat from the conditioned space. The temperature of the photodiode will increase and it will give up heat to the plenum 36 when its temperature exceeds that of the plenum.

Thus, the temperature of the conditioned space 31 may be raised or lowered relative to the plenum temperature by operating the solid state radiative heat pump 10 under forward or reverse bias, respectively. An important consideration in operation is the amount of heat that can be radiated or absorbed. For example, the photodiode cannot absorb more radiation than the conditioned space can emit, and thus the reverse biased mode is limited in cooling capacity to $\sigma T^4$, where $\sigma$ is the Stefan-Boltzmann constant $(5.67 \times 10^{-8}\ Wm^{-2}T^{-4})$ and T is the absolute temperature. Thus, if T=300 K., $\sigma T^4 = 460$ watts per square meter. A typical cooling or heating requirement for a well-designed building is roughly 20 watts per square meter of floor area. In the forward biased cooling mode, the maximum capacity will also be on the order of $\sigma T^4$, but this value is not an absolute maximum.

As mentioned previously, the net rate of heat transfer is proportional to a statistical Boltzmann factor F, $F = \exp(-E_{gap}/kT)$, and for typical semiconductors with an $E_{gap}$ of about 1.0 eV, the factor F is about $4 \times 10^{-18}$. With a gap energy of 0.20 eV, in accordance with the present invention, the statistical factor F is much larger (greater than $10^{-4}$), leading to a much greater cooling capacity per unit of junction area of the photodiode.

Figure 3:
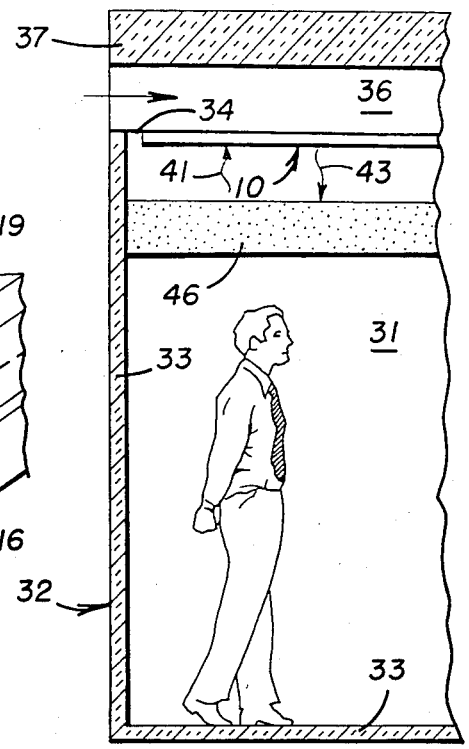
FIGS. 2, 3 and 4 illustrate different arrangements wherein a solid state radiative heat pump can be utilized to heat or cool a controlled space.

FIG. 3 illustrates a system similar to that of FIG. 2 but with the convection shield 38 replaced by a thermal storage mass 46 in intimate thermal contact with the conditioned space 31. During the cooling season, the heat pump 10 can be operated under reverse bias to cool the thermal storage means 46, which in turn absorbs heat from the conditioned space 31 twenty-four hours per day. This arrangement allows operation at non-peak hours of electrical usage and achieves a high coefficient of performance by rejecting heat to the plenum 36 during periods of low outside temperature.

Conversely, when operating under forward bias for heating of the conditioned space, the system can be operated primarily during periods of high outside temperatures.

Figure 4:
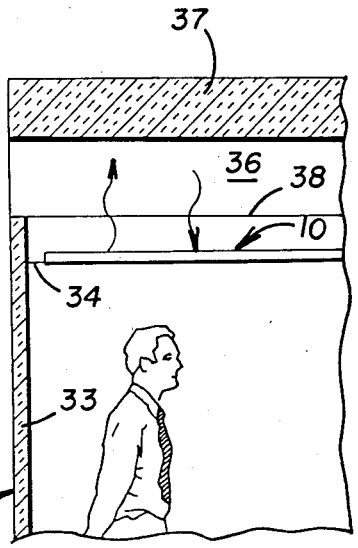

FIG. 4 illustrates a system wherein the solid state radiative heat pump 10 is disposed on the upper side of the heat conductive wall 34 and radiates upwardly through the convection shield 38 to plenum 36. In this arrangement, a forward bias on the photodiode of heat pump 10 will cause an excess of infrared radiation from the photodiode to the plenum, resulting in a cooling of the photodiode. Since the photodiode is in good thermal contact with the conditioned space 31, a cooling of the photodiode will cool the conditioned space. That is, when forward biased, the heat pump 10 will pump heat from the conditioned space 31 to plenum 36. In like manner, when the photodiode is reverse biased, heat will be pumped from the plenum to the conditioned space.

Figure 7:
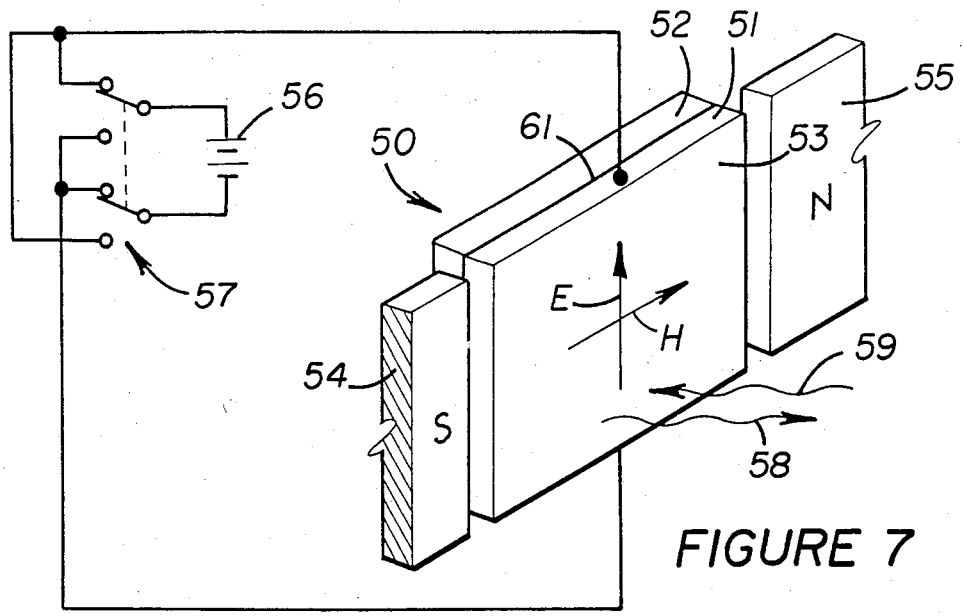
FIG. 7 is alternative form of a solid state radiative heat pump made in accordance with the present invention.

FIG. 7 shows a solid state radiative heat pump 50 with another manner of producing a charge carrier excess or deficit (compared to thermal equilibrium) to thereby cause a thermal infrared radiation excess or deficit. In this embodiment a thin film or thin crystal of narrow bandgap semiconducting material 51 with a gap energy in the range of 0.03–0.25 eV, mounted for support on a thermally conductive substrate 52, is placed in a magnetic field H parallel to the active surface 53 of the semiconductor 51. For purposes of illustration, the magnetic field is shown as being created by magnet poles 54 and 55. A battery 56 is suitably connected to semiconductor 51 through a reversing switch 57 to apply an electric field E which is orthogonal to the magnetic field H and parallel to the active surface of semiconductor 51.

In this configuration of magnetic and electric fields, the Hall effect produces either an excess or deficit of both electrons and holes at the active surface of the semiconductor 51, depending on the relative polarity of the applied fields. As before, an excess of electrons and holes will cause an excess of recombination radiation so the emitted infrared radiation (represented by the arrow 58) from the active surface 51 will exceed the radiation (represented by arrow 59) absorbed from an object towards which the active surface of the semiconductor faces. As before the active surface 51 should be etched or otherwise treated to provide a low surface recombination velocity. In addition, the back surface of the semiconductor 51 should be polished or otherwise treated to provide a high surface recombination velocity.

The solid state radiative heat pump 50 of FIG. 7 also includes an infrared reflective layer 61 between the back surface of semiconductor 51 and substrate 52 to inhibit transmission of radiant energy, and an antireflective layer 62 on the front surface 53 of the semiconductor to enhance transmission of radiant energy, as previously explained. The reflection layer 61 is electrically insulated from semiconductor 51. The heat pump 50 can be used in the same manner as described in connection with FIGS. 2–4 to heat or cool a conditioned space. Although the semiconductor 51 of heat pump 50 requires magnetic and electric fields for operation, the semiconductor 51 is simpler to fabricate than the photodiode 11 of heat pump 20 since the semiconductor 51 does not have p and n regions with a p-n junction at their interface. The semiconductor 51 should be intrinsic (undoped) or slightly p-type.

Figure 8:
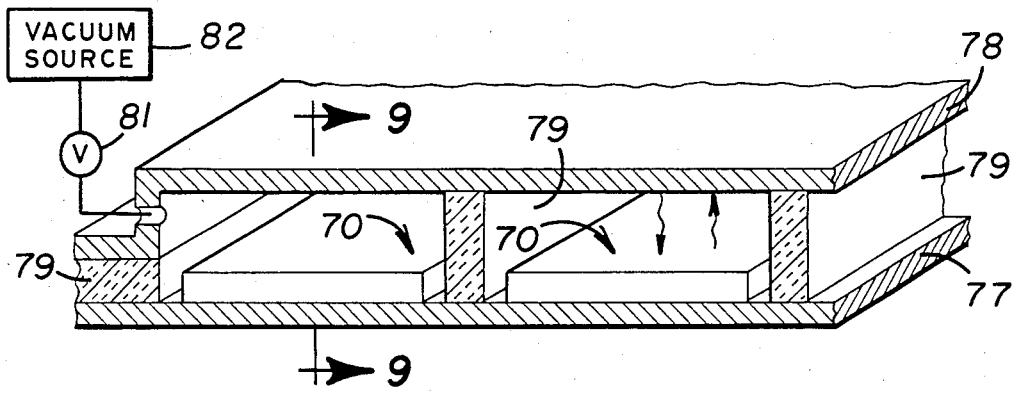
FIG. 8 is a sectional and perspective view of a solid state radiative heat pump utilizing evanescent wave coupling to enhance radiant transmission.
Figure 9:
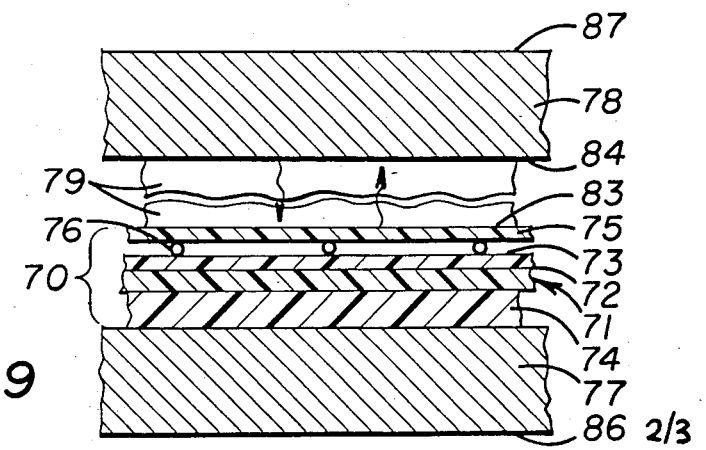
FIG. 9 is a sectional view, taken on line 9—9 of FIG. 8.

FIGS. 8 and 9 illustrate an alternative embodiment of the invention for enhancing the transmission of infrared photons through the active surface of the semiconductor.

One of the problems in the use of semiconductors to emit and absorb infrared radiation is that semiconductors and especially narrow bandgap semiconductors, have large indices of infrared refraction. For example, an indium antimonide semiconductor has an infrared index of 4. As a consequence, the critical angle, arc sin ($\frac{1}{4}$), is only 14 degrees. Thus, only radiation produced within a small cone of angles can penetrate the front surface of the semiconductor into air or a vacuum. The rest of the radiation is reflected internally. This problem of internal reflection of radiation is greatly reduced by the evanescent wave coupling approach used in the embodiment of FIGS. 8 and 9.

In these figures, the solid state radiative heat pumps 70 each comprise an infrared photodiode 71 having a p-n junction 72 and an active surface 73, the photodiode being supported on a heat conductive substrate 74. Again, the active surface 73 should be treated to provide a low surface recombination velocity. Front and back contacts, not shown in these figures but as previously described in connection with FIG. 1, are provided so that the photodiodes 71 may be biased forwardly or reversely.

Instead of having an anti-reflection layer coated on the active front surface of the photodiode, as in FIG. 1, a thin film passive layer 75, having an index of infrared refraction equal to that of the photodiode is spaced from the active surface of the photodiode. The gap thickness is much less than the wavelength of the infrared radiation of the photodiode, and preferably about ½ micron. The dimension of this submicron gap can be maintained with the aid of small number of submicron plastic spheres 76. Alternatively small spacers can be formed on the passive layer 75 by lithographic techniques. It is desirable to use as few such spacers as possible to minimize ordinary heat conduction across the submicron gap.

Two parallel structural plates 77 and 78, with high thermal conductivity, are provided and the heat pumps 70 are placed with their substrates 74 in good thermal contact with plate 77. A plurality of spacers 79, made of a suitable thermal insulative material support the plates 77 and 78 away from each other and seal around their peripheries to form an air-tight compartment between the plates. This compartment is connected through valve 81 to vacuum source 82, so that a vacuum is formed and maintained in the submicron gap between the active surface 73 of the photodiode and the passive layer 75.

The outer surface 83 of the passive layer 75 and the inner surface 84 of the structural plate 78 are both preferably coated with a suitable emissive paint for optimum operation. The outer surfaces 86 and 87 of plates 77 and 78 can transmit heat by conduction and/or radiation, as desired.

In operation, when the photodiode 71 is forward biased, it will emit an excess of infrared radiation as previously described. Now, however, because of the submicron vacuum gap, and because the passive layer 75 has a matching index of refraction, the internal infrared radiation inside the photodiode can "tunnel" through the gap, and no internal reflection will occur. This type of infrared transmission is referred to herein as "evanescent wave coupling" because it is caused by the evavescent wave which can penetrate into the vacuum gap even under conditions of total internal reflection. Heat is then transferred by ordinary thermal radiative transfer to the structural plate 78 and then radiated outwardly therefrom. Thermal transmission will be in an opposite manner when the photodiode is operated under reverse bias, with a deficit of infrared radiation. The deficit will likewise tunnel through the submicron gap.

A substantial increase in performance will result from the use of the above described evanescent wave coupling. The basic reason is that heat radiation has a higher intensity in a medium with a high index of refraction than in a vacuum. As pointed out above, the absolute maximum rate of heat pumping in the reverse-bias cooling mode is limited to $\sigma T^4$, which is about 460 watts per square meter for a temperature of 300 K. In a medium with index of refraction n, the corresponding limit is larger by a factor of $n^2$. For example, with indium antimonide, only about 10% of 300 K. black body radiation (i.e. the wavelengths less then about 7.3 microns) can be pumped. If a black body is being cooled, using a macroscopic air gap, the maximum cooling rate would be only about 46 watts per square meter. However, if evanescent wave coupling is used, the corresponding limit is increased to 740 watts per square meter. A suitable semiconductor with a smaller bandgap or larger infrared index would be capable of heat pumping at even higher rates.

Since the temperature difference between the plates 77 and 78 may be many degrees, the mechanical structure shown in FIGS. 8 and 9 must be capable of accommodating the differential thermal expansion due to these temperature differences.

The evanescent wave coupling technique described above will also increase the efficiency of a semiconductor utilizing the Hall effect, as described in connection with FIG. 7.

Figure 10:
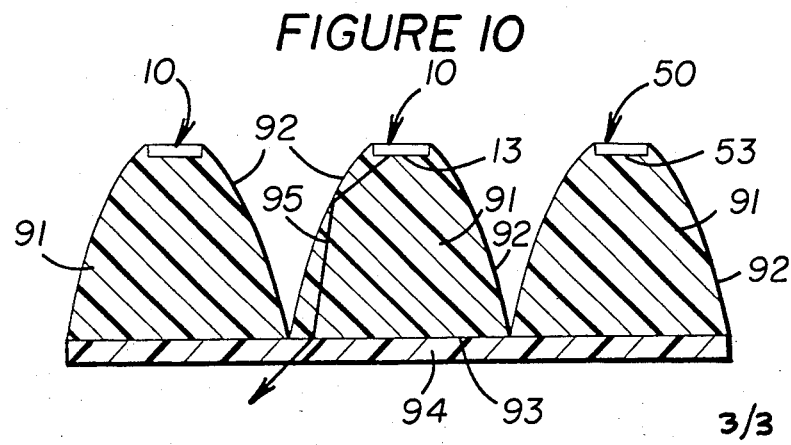
FIG. 10 is a sectional view of an alternate manner of enhancing radial transmission.

FIG. 10 illustrates another manner in which transmission of infrared radiation through the active surface of the emitting semiconductor may be enhanced. In this embodiment, solid state radiative heat pumps 10 are disposed so that their active surfaces 13 are in contact with the upper surface of a generally paraboloid shaped couplers 91 which have their side surfaces covered with a suitable infrared reflecting material 92, such as aluminum. The bottom, flat surfaces 93 of the couplers 91 are in contact with an anti-reflection layer 94. The couplers 91 are substantially transparent to infrared radiation and have an index of infrared refraction about equal to that of the semiconductor diode of heat pumps 10. For example, the couplers 91 may be a semiconductor with a higher energy band gap, such as silicon. As previously discussed in connection with FIG. 1, the anti-reflection layer 94 has an infrared index of refraction equal to the square root of that of the semiconductor diode of heat pump 10.

In this embodiment, photons emitted by each heat pump 10 and which reach the active surface 13 thereof by a path greater than the critical angle can now pass through the active surface 13 into its coupler 91, since its index of refraction closely matches that of the heat pump material instead of being totally internally reflected. These photons will then be reflected by the reflector surface 92 and will be collimated so that the angles of their paths relative to the coupler surface 93 will be less than the critical angle of internal reflection enabling the photons to pass through the coupler surface 93 rather than be reflected at that surface. A typical photon path is indicated by reference numeral 95. The anti-reflection layer 94 further reduces the adverse effect of internal reflection.

In like manner, a coupler 91 may be used in conjunction with the active surface 53 of the heat pump 50 described in connection with FIG. 7.

In connection with the solid state radiative heat pumps 10, 50 and 70 described above, infrared filter layers that introduce spectral selectivity will enhance performance in certain configurations. High energy photons flow from hot to cold almost independently of the bias voltage, producing a counter-productive energy flow. This radiant transfer can be inhibited by filtering out these high energy photons with suitable reflecting filters such as multilayer dielectric interference filters. For solid state radiative heat pumps with a p-n junction, the photon energy, $E_m$, at which the filter cut-off should be placed, may be found from the equation, $$E_m = qV(1 - T_1/T_2)^{-1},$$

where V is the typical bias voltage in use, q is the magnitude of the electronic charge, and $T_1$ and $T_2$ are the diode and external temperatures. (For $T_1>T_2$, $qV<0$, and for $T_2>T_1$, $qV>0$. Thus, $E_m$ is always positive.) For solid state radiative heat pumps with orthogonal electric and magnetic fields, there is a similar condition, but the bias voltage, V, must be replaced by a factor proportional to the product of the current and magnetic field.

In the description above, the biasing of a photodiode with a p-n junction and the use of the Hall effect of a semiconductor have been described as ways in which an excess or deficit of charge carriers can be produced in a semiconductor. Another technique can be the injection by a biased heterojunction, which has the added advantage of reducing infrared radiation self-absorption losses, if the bandgap on the junction's inactive side is larger than that on the active side. Another possible technique is the use of a Schottky barrier (metal-semiconductor junction) for injecting and extracting carriers. In wider bandgap semiconductors with impurity absorption and emission of radiation, an n-n+ or p-p+ junction is desirable (n+ or p+ referring to a material heavily doped n or p type). For example, electrons from the heavily doped n+ side could be injected under forward bias through the junction where they would combine with ionized impurities to produce infrared radiation.

As used in this application, and in the claims, the term "thin film" is to be considered as including amorphous or crystalline films and also thin crystalline layers.

The foregoing description of preferred embodiments has been presented for purposes of illustration and description. It is not intended to be exhaustive or to limit the invention to the precise forms described, and obviously many modification and variations are possible in light of the above teaching. The embodiments were chosen and described in order to best explain the principles of the invention and its practical application to thereby enable others in the art to best utilize the invention in various embodiments and with various modifications as are suited to the particular use contemplated. Although the use of the invention has been largely directed towards the heating or cooling of a room of a house, it is clear that the invention may be used in other environments wherein objects are to be heated or cooled, or other systems wherein radiant heat is to be pumped from one heat sink to another. It is intended that the scope of the invention be defined by the claims appended hereto.

What is claimed is:

1. A solid state radiative heat pump comprising:
   a thin film semiconductor having an active surface and a back surface and being capable of emitting an infrared radiation deficit from said active surface when a charge carrier deficit is present in said semiconductor,
   enhancing means for enhancing transmission of infrared radiation through said active surface from inside said semiconductor to outside thereof and vice versa,
   inhibiting means for inhibiting transmission of infrared radiation through said back surface of said semiconductor,
   means for producing a deficit of charge carriers in said semiconductor.

2. A solid state radiative heat pump as set forth in claim 1, wherein said semiconductor has a diode junction, and wherein said means for producing a deficit of charge carriers in said semiconductor has the function of applying a reverse bias to said diode junction.

3. A solid state radiative heat pump as set forth in claim 2,
   wherein said enhancing means includes a passive layer spaced from said active surface of said semiconductor by no more than about one micron, said passive layer having an infrared index of refraction substantially equal to that of said semiconductor, and means for maintaining a vacuum between said passive layer and said active surface of said semiconductor.

4. A solid state radiative heat pump as set forth in claim 2,
   wherein said enhancing means comprises a coating on said active surface of said semiconductor, said coating being transparent to infrared radiation and having an index of infrared refraction approximately equal to the square root of the index of infrared refraction of said semiconductor.

5. A solid state radiative heat pump as set forth in claim 2,
   wherein said enhancing means comprises a coupler in contact with said active surface of said semiconductor, said coupler having a flat surface spaced from said active surface of said semiconductor and a reflector surface between said active surface of said semiconductor and said flat surface of said coupler, said coupler having an infrared index of refraction close to that of said semiconductor, and said coupler being shaped to reflect photons emitted through said active surface towards said flat surface with the angles of the paths of the reflected photons relative to said flat surface being less than the critical angle of internal reflection.

6. A solid state radiative heat pump as set forth in claim 2, wherein said semiconductor has a direct bandgap with a gap energy in the range of 0.03–0.25 eV.

7. A solid state radiative heat pump as set forth in claim 1,
   wherein said means for producing an excess or deficit of charge carriers in said semiconductor has the function of establishing electric and magnetic fields orthogonal to each other and parallel to the active surface of said semiconductor.

8. A solid state radiative heat pump as set forth in claim 7,
   wherein said enhancing means includes a passive layer spaced from said active surface of said semiconductor by no more than about one micron, said passive layer having an infrared index of refraction substantially equal to that of said semiconductor, and means for maintaining a vacuum between said passive layer and said active surface of said semiconductor.

9. A solid state radiative heat pump as set forth in claim 7,
   wherein said enhancing means comprises a coating on said active surface of said semiconductor, said coating being transparent to infrared radiation and having an index of infrared refraction approximately equal to the square root of the index of infrared refraction of said semiconductor.

10. A solid state radiative heat pump as set forth in claim 7,
    wherein said enhancing means comprises a coupler in contact with said active surface of said semiconductor, said coupler having a flat surface spaced from said active surface of said semiconductor and a reflector surface between said active surface of said semiconductor and said flat surface of said coupler, said coupler having an infrared index of refraction close to that of said semiconductor, and said coupler being shaped to reflect photons emitted through said active surface towards said flat surface with the angles of the paths of the reflected photons relative to said flat surface being less than the critical angle of internal reflection.

11. A solid state radiative heat pump as set forth in claim 1, and further including:
means forming a chamber having a heat conductive wall,
said semiconductor being mounted on said heat conductive wall in heat conductive relationship therewith, and with said active surface of said semiconductor facing away from said wall.

12. A solid state radiative heat pump as set forth in claim 11, wherein said semiconductor has a diode junction, and wherein said means for producing a deficit of charge carriers in said semiconductor has the function of applying a reverse bias to said diode junction.

13. A solid state radiative heat pump as set forth in claim 11,
wherein said means for producing an excess or deficit of charge carriers in said semiconductor has the function of establishing electric and magnetic fields orthogonal to each other and parallel to said active surface of said semiconductor.

14. A solid state radiative heat pump comprising:
a thin-film semiconductor having an active surface and a back surface and being capable of emitting an infrared radiation excess or deficit from said active surface when a charge carrier excess or deficit, respectively, is present in said semiconductor,
enhancing means for enhancing transmission of infrared radiation through said active surface from inside said semiconductor to outside thereof and vice versa,
inhibiting means for inhibiting transmission of infrared radiation through said back surface of said semiconductor,
means for selectively producing an excess or deficit of charge carriers in said semiconductor.

15. A solid state radiative heat pump as set forth in claim 14 wherein said semiconductor has a diode junction, and wherein said means for selectively producing an excess or deficit of charge carriers in said semiconductor has the function of selectively applying a forward or reverse bias across said diode junction.

16. A solid state radiative heat pump as set forth in claim 15,
wherein said enhancing means includes a passive layer spaced from said active surface of said semiconductor by no more than about one micron, said passive layer having an infrared index of refraction substantially equal to that of said semiconductor, and means for maintaining a vacuum between said passive layer and said active surface of said semiconductor.

17. A solid state radiative heat pump as set forth in claim 15,
wherein said enhancing means comprises a coating on said active surface of said semiconductor, said coating being transparent to infrared radiation and having an index of infrared refraction approximately equal to the square root of the index of infrared refraction of said semiconductor.

18. A solid state radiative heat pump as set forth in claim 15,
wherein said enhancing means comprises a coupler in contact with said active surface of said semiconductor, said coupler having a flat surface spaced from said active surface of said semiconductor and a reflector surface between said active surface of said semiconductor and said flat surface of said coupler, said coupler having an infrared index of refraction close to that of said semiconductor, and said coupler being shaped to reflect photons emitted through said active surface towards said flat surface with the angles of the paths of the reflected photons relative to said flat surface being less than the critical angle of internal reflection.

19. A solid state radiative heat pump as set forth in claim 15, wherein said semiconductor has a direct bandgap with a gap energy in the range of 0.03–0.25 eV.

20. A solid state radiative heat pump as set forth in claim 14,
wherein said means for reversibly producing an excess or deficit of charge carriers in said semiconductor has the function of establishing electric and magnetic fields orthogonal to each other and parallel to said active surface of said semiconductor and has the function of selectively reversing the direction of one of said fields.

21. A solid state radiative heat pump as set forth in claim 20,
wherein said enhancing means includes a passive layer spaced from said active surface of said semiconductor by no more than about one micron, said passive layer having an infrared index of refraction substantially equal to that of said semiconductor, and means for maintaining a vacuum between said passive layer and said active surface of said semiconductor.

22. A solid state radiative heat pump as set forth in claim 20,
wherein said enhancing means comprises a coating on said active surface of said semiconductor, said coating being transparent to infrared radiation and having an index of infrared refraction approximately equal to the square root of the index of infrared refraction of said semiconductor.

23. A solid state radiative heat pump as set forth in claim 20,
wherein said enhancing means comprises a coupler in contact with said active surface of said semiconductor, said coupler having a flat surface spaced from said active surface of said semiconductor and a reflector surface between said active surface of said semiconductor and said flat surface of said coupler, said coupler having an infrared index of refraction close to that of said semiconductor, and said coupler being shaped to reflect photons emitted through said active surface towards said flat surface with the angles of the paths of the reflected photons relative to said flat surface being less than the critical angle of internal reflection.

24. A solid state radiative heat pump as set forth in claim 14, and further including:
means forming a chamber having a heat conductive wall,
said semiconductor being mounted on said heat conductive wall in heat conductive relationship therewith, and with said active surface of said semiconductor facing away from said wall.

25. A solid state radiative heat pump as set forth in claim 24 wherein said semiconductor has a diode junction, and wherein said means for selectively producing an excess or deficit of charge carriers in said semiconductor has the function of selectively applying a forward or reverse bias across said diode junction.

26. A solid state radiative heat pump as set forth in claim 24,
wherein said means for reversibly producing an excess or deficit of charge carriers in said semiconductor has the function of establishing electric and magnetic fields orthogonal to each other and parallel to said active surface of said semiconductor and has the function of selectively reversing the direction of one of said fields.

27. A solid state radiative heat pump comprising:
a thin-film semiconductor having an active surface and a back surface and being capable of emitting an infrared radiation excess from said active surface when a charge carrier excess is present in said semiconductor, said semiconductor having a direct bandgap diode junction and having a gap energy in the range of 0.03–0.25 eV,
enhancing means for enhancing transmission of infrared radiation through said active surface from inside said semiconductor to outside thereof and vice versa,
inhibiting means for inhibiting transmission of infrared radiation through said back surface of said semiconductor,
means for applying a forward bias across said diode junction.

28. A solid state radiative heat pump as set forth in claim 27,
wherein said enhancing means includes a passive layer spaced from said active surface of said semiconductor by no more than about one micron, said passive layer having an infrared index of refraction substantially equal to that of said semiconductor, and means for maintaining a vacuum between said passive layer and said active surface of said semiconductor.

29. A solid state radiative heat pump as set forth in claim 27,
wherein said enhancing means comprises a coating on said active surface of said semiconductor, said coating being transparent to infrared radiation and having an index of infrared refractive approximately equal to the square root of the index of infrared refraction of said semiconductor.

30. A solid state radiative heat pump as set forth in claim 27,
wherein said enhancing means comprises a coupler in contact with said active surface of said semiconductor, said coupler having a flat surface spaced from said active surface of said semiconductor and a reflector surface between said active surface of said semiconductor and said flat surface of said coupler, said coupler having an infrared index of refraction close to that of said semiconductor, and said coupler being shaped to reflect photons emitted through said active surface towards said flat surface with the angles of the paths of the reflected photons relative to said flat surface being less than the critical angle of internal reflection.

31. A solid state radiative heat pump as set forth in claim 27, and further including:
means forming a chamber having a heat conductive wall,
said semiconductor being mounted on said heat conductive wall in heat conductive relationship therewith, and with said active surface of said semiconductor facing away from said wall.

32. A solid state radiative heat pump comprising:
a thin-film semiconductor having an active surface and a back surface and being capable of emitting an infrared radiation excess or deficit from said active surface when a charge carrier excess or deficit, as compared to that present in thermal equilibrium, is present in said semiconductor,
a passive layer spaced from said active surface of said semiconductor by no more than about one micron, said passive layer having an infrared index of refraction substantially equal to that of said semiconductor,
means for maintaining a vacuum between said passive layer and said active surface of said semiconductor,
means for causing said semiconductor to emit infrared radiation in an amount other than that emitted when in thermal equilibrium.

33. A solid state radiation heat pump as set forth in claim 32, wherein said means for maintaining a vacuum between said passive layer and said active surface of said semiconductor includes:
means forming an enclosed vacuum chamber having a pair of spaced-apart rigid plates of high thermal conductivity, said semiconductor and passive layer being disposed between said plates with said semiconductor being in heat conductive relationship with one of said plates.

34. A solid state radiative heat pump as set forth in claim 32, wherein said passive layer is spaced from the other of said rigid plates and wherein the surfaces of said passive layer and the other of said plates which face each other are both infrared emissive.

35. A solid state radiative heat pump as set forth in claim 32,
wherein said semiconductor has a direct bandgap diode junction, and has a gap energy in the range of 0.03–0.25 eV, and
wherein said means for causing said semiconductor to emit infrared radiation has the function of applying a bias across said junction.

* * * * *